(12) United States Patent
Hoshina et al.

(10) Patent No.: US 9,250,480 B2
(45) Date of Patent: Feb. 2, 2016

(54) LIQUID CRYSTAL DISPLAY PANEL AND METHOD OF MANUFACTURING THE SAME

(71) Applicant: Japan Display Inc., Minato-ku (JP)

(72) Inventors: Katsuhiro Hoshina, Saitama-ken (JP); Tetsuya Iizuka, Saitama-ken (JP)

(73) Assignee: JAPAN DISPLAY INC., Minato-ku (JP)

( * ) Notice: Subject to any disclaimer, the term of this patent is extended or adjusted under 35 U.S.C. 154(b) by 0 days.

(21) Appl. No.: 14/521,261

(22) Filed: Oct. 22, 2014

(65) Prior Publication Data
US 2015/0037940 A1    Feb. 5, 2015

Related U.S. Application Data

(62) Division of application No. 13/275,669, filed on Oct. 18, 2011, now Pat. No. 8,902,397.

(30) Foreign Application Priority Data

Nov. 30, 2010   (JP) .................................. 2010-267494

(51) Int. Cl.
*G02F 1/00* (2006.01)
*H01L 33/08* (2010.01)
(Continued)

(52) U.S. Cl.
CPC ............ *G02F 1/1339* (2013.01); *G02F 1/1333* (2013.01); *G02F 1/13394* (2013.01); *G02F 1/133351* (2013.01); *H01L 27/1259* (2013.01); *G02F 2001/133354* (2013.01)

(58) Field of Classification Search
CPC .................................. G02F 1/13; G02F 1/1333
USPC ..................................................... 349/138, 91
See application file for complete search history.

(56) References Cited

U.S. PATENT DOCUMENTS 8,154,703 B2    4/2012  Manabe et al.
2002/0196393 A1*  12/2002  Tashiro et al. ................ 349/106
(Continued)

FOREIGN PATENT DOCUMENTS

JP    2002-258264    9/2002
JP    2003-195318 A  7/2003
(Continued)

OTHER PUBLICATIONS

Office Action issued Dec. 18, 2012, in Japanese Patent Application No. 2010-267494 (submitting English translation only).
(Continued)

*Primary Examiner* — Kaveh Kianni
(74) *Attorney, Agent, or Firm* — Oblon, McClelland, Maier & Neustadt, L.L.P.

(57) ABSTRACT

In one embodiment, a liquid crystal display panel includes an array substrate and a counter substrate each having a display region and a peripheral region arranged adjacent to the display region. A resin layer is formed either one of the array substrate and the counter substrate. A protrusion in the shape of a wall is arranged on the resin layer with a gap between the protrusion and the substrate opposing the protrusion. A seal material is formed between the array substrate and the counter substrate, and arranged between a peripheral portion of the display region and the protrusion for attaching the array substrate and the counter substrate. A liquid crystal layer is formed in a surrounded region by the array substrate, the counter substrate and the seal material.

3 Claims, 12 Drawing Sheets

(51) Int. Cl.
*G02F 1/1339* (2006.01)
*G02F 1/1333* (2006.01)
*H01L 27/12* (2006.01)

(56) References Cited

U.S. PATENT DOCUMENTS

| | | | |
|---|---|---|---|
| 2003/0162317 A1* | 8/2003 | Tanaka et al. | 438/48 |
| 2004/0001177 A1* | 1/2004 | Byun et al. | 349/187 |
| 2005/0078239 A1* | 4/2005 | Youn et al. | 349/106 |
| 2005/0129850 A1* | 6/2005 | Jung et al. | 427/258 |
| 2005/0140920 A1* | 6/2005 | Lee | 349/187 |
| 2005/0140921 A1* | 6/2005 | Lee et al. | 349/187 |
| 2007/0153183 A1* | 7/2007 | Choi et al. | 349/124 |
| 2007/0153216 A1* | 7/2007 | Kim | 349/156 |
| 2007/0153220 A1* | 7/2007 | Choi et al. | 349/187 |
| 2007/0153221 A1* | 7/2007 | Yoo et al. | 349/187 |
| 2007/0195217 A1* | 8/2007 | Miyashita et al. | 349/54 |
| 2008/0002137 A1* | 1/2008 | Kim et al. | 349/187 |
| 2009/0103021 A1* | 4/2009 | Manabe et al. | 349/106 |
| 2010/0245751 A1* | 9/2010 | Muneyoshi et al. | 349/149 |

FOREIGN PATENT DOCUMENTS

| | | |
|---|---|---|
| JP | 2006-30440 A | 2/2006 |
| JP | 2006-84881 | 3/2006 |
| JP | 2007-57569 A | 3/2007 |

OTHER PUBLICATIONS

Office Action issued on Feb. 26, 2013 in the corresponding Japanese Patent Application No. 2010-267494 (English Translation only).

* cited by examiner

LIQUID CRYSTAL DISPLAY PANEL AND METHOD OF MANUFACTURING THE SAME

CROSS-REFERENCE TO RELATED APPLICATION

This application is a divisional of U.S. application Ser. No. 13/275,669 filed Oct. 18, 2011, and is based upon and claims the benefit of priority from Japanese Patent Application No. 2010-267494, filed Nov. 30, 2010, the entire contents of each of which are incorporated herein by reference.

FIELD

Embodiments described herein relate generally to a liquid crystal display panel.

BACKGROUND

The liquid crystal display panel is mainly used as display devices for an information equipment, such as a computer, and a visual equipment for a television receiving set, etc. Generally, the liquid crystal display panel has an array substrate, a counter substrate, and a liquid crystal layer held between the substrates. The array substrate and the counter substrate have a display region, respectively. Between the array substrate and the counter substrate, a plurality of pillar-shaped spacers is arranged as a spacer device, for example, and the gap between both substrates is held uniformly.

The array substrate and the counter substrate are attached by a seal material of the shape of a rectangular frame arranged outside the display region of the both substrates. When forming the seal material, a thermosetting resin is applied to the peripheral portion of the counter substrate, for example, and the counter substrate and the array substrate are attached while the seal material is thermally cured. In the above-mentioned liquid crystal display panel, the seal material spreads on the array substrate and the counter substrate. In a liquid crystal display panel with wide frame width, even if the seal material spreads, the spread does not have a bad influence on the liquid crystal display panel.

However, when the seal material spreads in the liquid crystal display panel with a narrow frame width, such as a liquid crystal display panel for cellular phones, the spread have a bad influence on the liquid crystal display panel. For example, if the seal material flows into the display region, a defective display is caused. For this reason, in order to prevent the seal material from flowing into the display region, it is necessary to apply the seal material to a position near a substrate end. On the other hand, when the seal material has overflowed to the peripheries of the array substrate and the counter substrate, it becomes difficult to divide the array substrate and the counter substrate respectively from mother glass substrates in a good state.

In order to avoid that the seal material becomes an obstacle when cutting the mother glass substrates, it is necessary to paste the seal material departing from the peripheries of the respective array substrate and the counter substrate to the display region side at some extent. Above point is one of the causes which cannot make the small frame width of the liquid crystal display panel.

BRIEF DESCRIPTION OF THE DRAWINGS

The accompanying drawings, which are incorporated in and constitute a portion of the specification, illustrate embodiments of the invention, and together with the general description given above and the detailed description of the embodiments given below, serve to explain the principles of the invention.

DETAILED DESCRIPTION OF THE INVENTION

Figure 1:
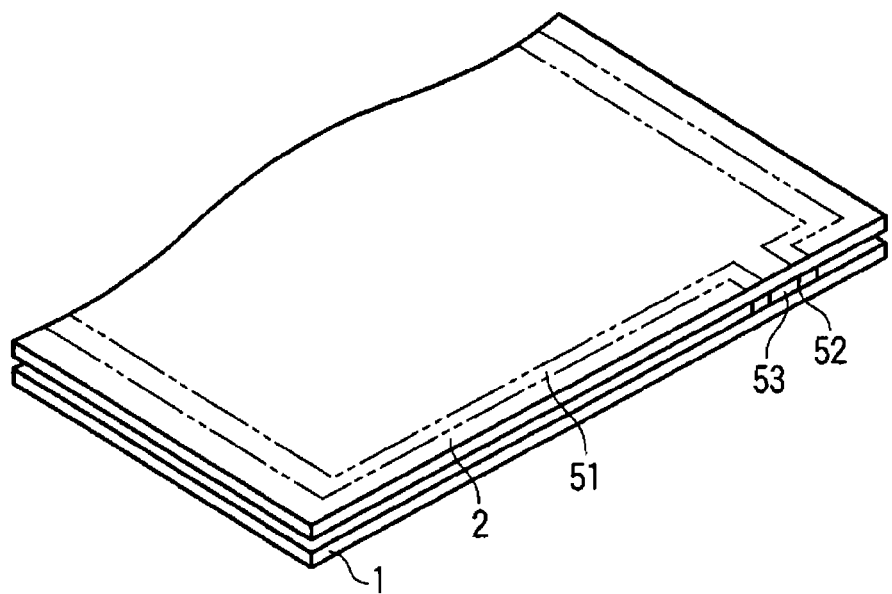
FIG. 1 is a perspective diagram showing a liquid crystal display panel according to a first embodiment.

A liquid crystal display panel according to an exemplary embodiment of the present invention will now be described with reference to the accompanying drawings wherein the same or like reference numerals designate the same or corresponding portions throughout the several views.

According to one embodiment, a liquid crystal display panel includes an array substrate having a display region and a peripheral region arranged adjacent to the display region; a counter substrate having the display region and the peripheral region, and arranged opposing the array substrate with a gap therebetween; a resin layer formed on the peripheral region of either one of the array substrate and the counter substrate; a protrusion in the shape of a wall arranged on the resin layer with a gap between the protrusion and the substrate opposing the protrusion; a seal material formed between the array substrate and the counter substrate, and arranged between a peripheral portion of the display region and the protrusion for attaching the array substrate and the counter substrate; and a liquid crystal layer formed in a surrounded region by the array substrate, the counter substrate and the seal material.

Hereafter, the liquid crystal display panel and the method of manufacturing the liquid crystal display panel according to the first embodiment are explained in detail, referring to drawings. Firstly, a structure of the liquid crystal display panel is explained. In this embodiment, the liquid crystal display panel is a COA (color filter on array) type.

Figure 2:
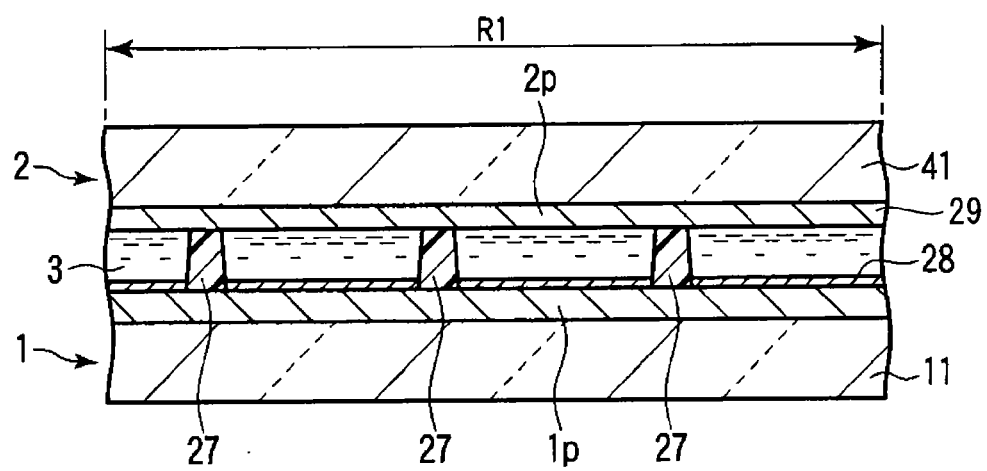
FIG. 2 is a cross-sectional view schematically showing the liquid crystal display panel shown in FIG. 1.

As shown in FIG. 1 and FIG. 2, the liquid crystal display panel is equipped with an array substrate 1, a counter substrate 2 arranged opposing the array substrate 1 with a predetermined gap between the array substrate 1 and the counter substrate 2, and a liquid crystal layer 3 held therebetween. A polarizing plate which is not illustrated is arranged at respective external surfaces of the array substrate 1 and the counter substrate 2. A back light unit which is not illustrated is arranged at the external surface side of the array substrate 1. Each of the array substrate 1 and the counter substrate 2 has a rectangular display region R1.

Figure 4:
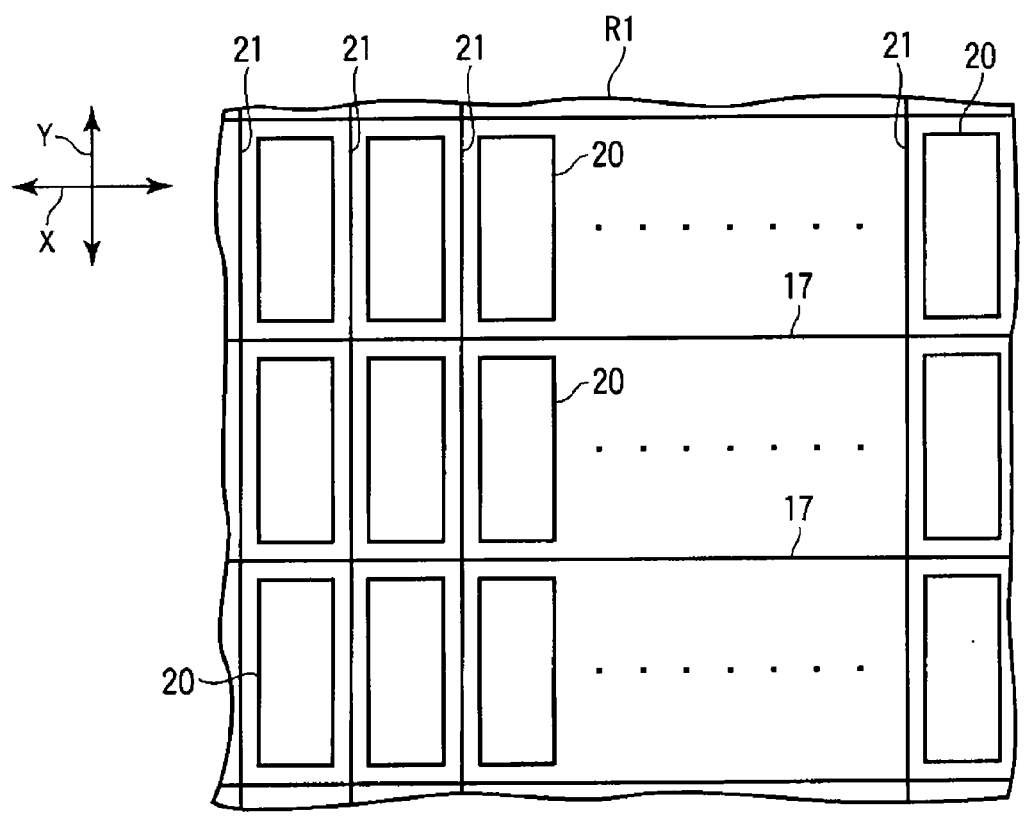
FIG. 4 is a plan view schematically showing a portion of an array substrate shown in FIG. 1 to FIG. 3.

The array substrate 1 includes a glass substrate 11 as a transparent insulating substrate. As shown in FIG. 4, a plurality of scanning lines 17 are formed in the display region R1 on the glass substrate 11. The scanning lines 17 extend in a row direction X orthogonally crossing with a column direction Y with an interval between adjacent scanning lines. Similarly, a plurality of signal lines 21 extend in a column direction Y with an interval between adjacent signal lines 21 while intersecting the plurality of scanning lines 17 and forming a lattice shape with the scanning lines 17.

Here, the array substrate 1 and the counter substrate 2 include a plurality of pixel portions 20 of the shape of a matrix arranged in the region surrounded with the plurality of scanning lines 17 and the plurality of signal lines 21. That is, each pixel portion 20 is formed in the region surrounded by adjacent two signal lines 21 and adjacent two scanning lines 17. A thin film transistor (TFT) as a switching element which is not illustrated is arranged in the pixel portions 20 of the array substrate 1, respectively. The TFT is arranged near an intersection portion with the scanning line 17 and the signal line 21 in more detail.

Figure 3:
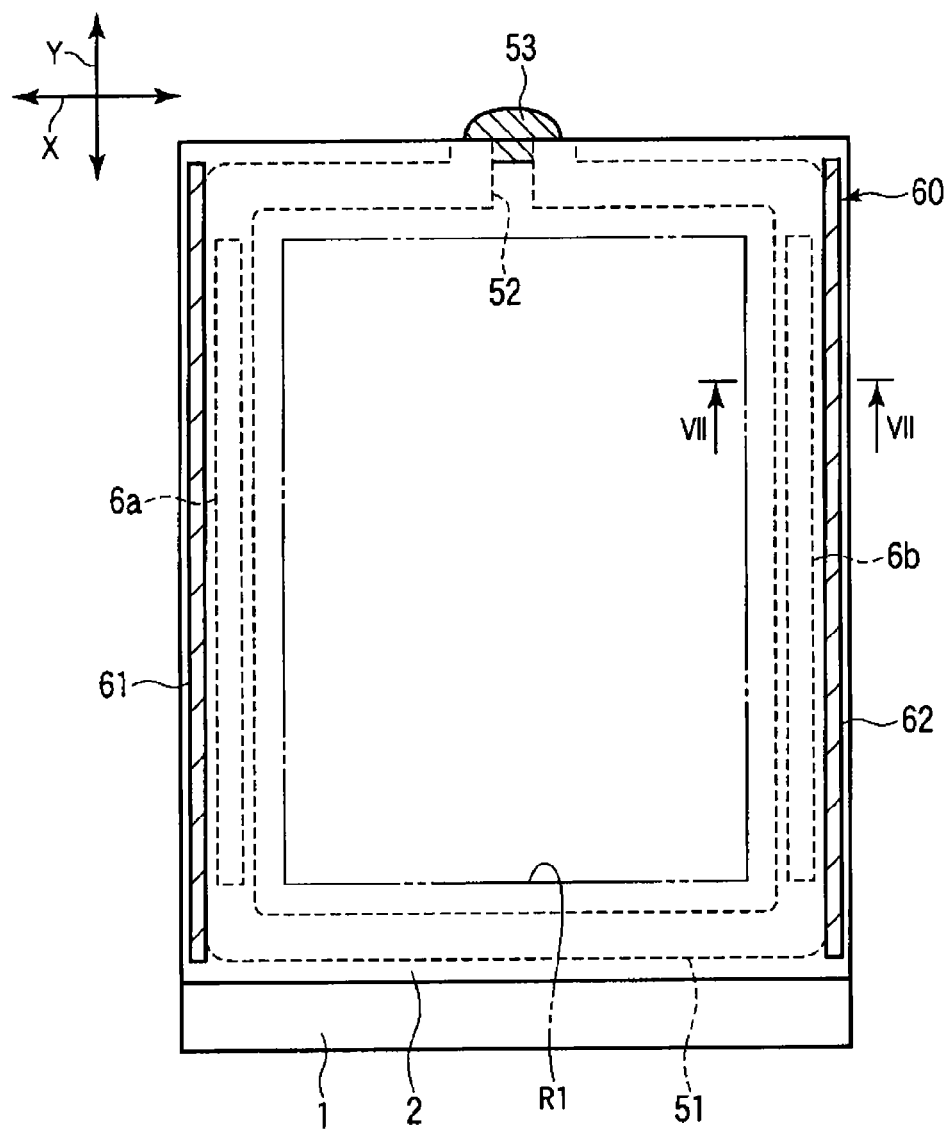
FIG. 3 is a plan view schematically showing the liquid crystal display panel shown in FIG. 1.

As shown in FIG. 3, a seal material 51 which attaches the array substrate 1 and the counter substrate 2 is formed at a peripheral portion of the display region R1, and also driving circuits 6a and 6b are arranged along the column direction Y. Moreover, protrusions 61 and 62 of a barrier shape for preventing spread of the seal material 51 are formed outside the driving circuits 6a and 6b along with the seal material 51.

Figure 5:
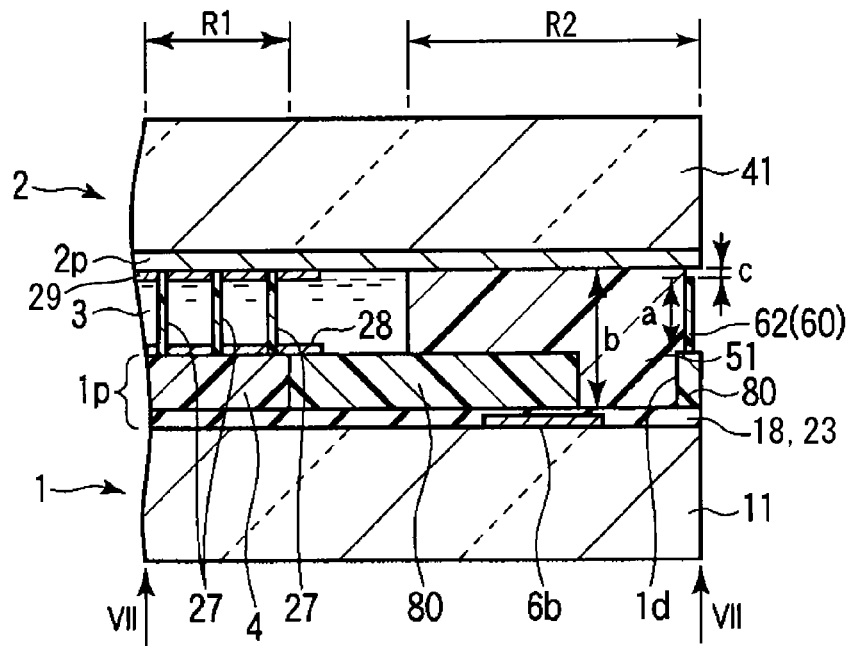
FIG. 5 is an expanded cross-sectional view schematically showing the peripheral portion of the liquid crystal display panel taken along line VII-VII in FIG. 3.

FIG. 5 is an expanded cross-sectional view schematically showing the peripheral portion of the above-mentioned liquid crystal display panel taken along line VII-VII of FIG. 3. In the display region R1, the TFT is formed, and also an interlayer insulating layer 18 and a protection insulating layer 23 formed of a SiO2 film and a SiN3 layer are arranged on the glass substrate 11 although not illustrated. A color filter 4 of a COA structure is laminated on the insulating layers 18 and 23. Furthermore, a plurality of pillar-shaped spacers 27 for forming the gap between the array substrate 1 and the counter substrate 2 are arranged on an array pattern 1p containing the signal line 21, the scanning line 17, the TFT, etc.

A color filter 4 is formed on the protection insulating layer 23. The color filter 4 includes an insulating characteristics, and also functions as a resin layer for making flat unevenness caused by wirings on the substrate, etc. In this embodiment, the color filter 4 has a plurality of red colored layers, green colored layers, and blue colored layers. In addition, when arranging the color filter 4 on the counter substrate 2, an insulating transparent resin layer is arranged on the array substrate 1 as a planarization film in place of the color filter 4. The transparent resin layer is arranged on the signal line, the scanning line, and the switching element, and makes flat unevenness of the array substrate surface produced by the wirings. That is, the transparent resin layer covers approximately whole display region.

As mentioned-above, the array pattern 1p is formed on the glass substrate 11. On the array pattern 1p, the plurality of pillar-shaped spacers 27 as a spacer device are formed. An alignment film 28 is formed on the array pattern 1p.

On the other hand, as shown in FIG. 3 and FIG. 5, the array pattern 1p and the barrier pattern 60 are formed on the outside of the display region R1 on the glass substrate 11. In more detail, the array pattern 1p includes the driving circuits 6a and 6b, the interlayer insulating layer 18, the protection insulating layer 23, and a shield pattern 80 in the outside of the display region R1.

The respective driving circuits 6a and 6b are arranged by sandwiching the display region R and opposing each other in the row direction X. When forming the TFT, etc., the driving circuits 6a and 6b are simultaneously formed by the same material as the TFT, for example, poly-silicon, etc. The driving circuits 6a and 6b are Y drivers connected to the scanning line 15 and an auxiliary capacitance line which is not illustrated.

The shield pattern 80 is formed of a resin layer, and is arranged adjacent to the periphery of the color filter 4. The shield pattern 80 is formed in the shape of a rectangular frame shape using a resin of a light blocking effect. The shield pattern 80 shields the light (back light) which leaks from the outside of the display region R1.

In addition, the shield pattern 80 may be arranged on the counter substrate 2 like the above-mentioned color filter 4. When arranging the shield pattern 80 on the counter substrate 2, the same transparent resin layer as the planarization film, such as an acrylic film, for example, is arranged on the array substrate 1 in the display region R1 in place of the shield pattern 80.

The array substrate 1 has a concave portion 1d in the outside of the display region R1. The concave portion 1d is concaved toward the array substrate 1 from the counter substrate 2. In this embodiment, the concave portion 1d is formed by removing a portion of the shield pattern 80. The concave portion 1d is formed approximately in the shape of a rectangular frame along the seal material application region R2.

The barrier pattern 60 is arranged on the same resin layer as the shield pattern so that the barrier pattern 60 sandwiches the display region R1 along the periphery of the display region R1 of the rectangular shape, i.e., both the long ends. The barrier pattern 60 is formed in either one of the array substrate 1 and the counter substrate 2, and includes projections in the shape of a wall formed so as to have a small gap between the projection and the opposing substrate. In this embodiment, the barrier pattern 60 is formed on the array substrate 1 at the periphery of the display region R1, and includes the projections 61 and 62 of the shape of the wall having a small gap between the projections 61, 62 and the counter substrates 2.

The projections 61 and 62 are formed on the shield pattern 80 (on the planarization film formed of transparent resin when the shield pattern 80 is arranged on the counter substrate 2). The projections 61 and 62 extend in the column direction Y. The projection 61 is arranged at the periphery of the display region R1 along the driving circuit 6a. On the other hand, the projection 62 is arranged on the opposing side of the projection 62 along the driving circuit 6b.

In addition, the projections 61 and 62 may be arranged on the same resin layer as the planarization film arranged at the periphery of the display region R1 of the array substrate 1.

The projections 61 and 62 suppress the spread of the seal material 51 to the periphery of the array substrate 1 and the counter substrate 2 as mentioned later. The projections 61 and 62 are simultaneously formed in the array substrate 1 with the same material as the pillar-shaped spacer 27. The projections 61 and 62 are formed lower than the pillar-shaped spacer 27. However, the same height as the pillar-shaped spacer 27 may be selected for the projections 61 and 62. Moreover, the shield pattern 80 and the barrier pattern 60 are formed excepting for a portion opposing a liquid crystal injecting mouth 52 which is mentioned-later.

As shown in FIG. 1, FIG. 2, FIG. 3, and FIG. 5, the counter substrate 2 is equipped with a glass substrate 41 as a transparent insulating substrate. On the glass substrate 41, a counter electrode formed with transparent electric conductive materials, such as ITO, and an alignment film 29 are formed in order. As mentioned-above, a counter pattern 2p is formed on the glass substrate 41.

The array substrate 1 and the counter substrate 2 are arranged opposing each other with a predetermined gap by the plurality of pillar-shaped spacers 27. The seal material 51 is formed in the periphery of the array substrate 1 and the counter substrate 2 in the shape of a rectangular frame, and is located between the periphery of the display region R1 and the projections 61, and between the periphery of the display region R1 and the projection 62.

The array substrate 1 and the counter substrate 2 are attached each other by the seal material 51. The seal material 51 covers the whole driving circuits 6a and 6b. The spread (spread to the row direction X) of the seal material 51 to the periphery of the array substrate 1 and the counter substrate 2 is suppressed by the projections 61 and 62 (barrier pattern 60). In addition, the projections 61 and 62 contact the side of the seal material 51. However, since the projections 61 and 62 in the shape of a wall are formed for suppressing the spread of the seal material 51, they may not necessarily become the form in which the projections 61 and 62 always contact the whole portion of the seal material 51, and may become a form in which the projections 61 and 62 partially contact the seal material 51. The above-mentioned concave portion 1d is located, respectively between the shield pattern 80 and the projection 61, and between the shield pattern 80 and the projection 62. At least the outer edge portion of the seal material 51 is accommodated in the concave portion 1d.

The liquid crystal layer 3 is formed in a region surrounded by the array substrate 1, the counter substrate 2, and the seal material 51. The liquid crystal injecting mouth 52 is formed in a portion of the seal material 51, and the liquid crystal injecting mouth is sealed with a sealing agent 53. Thus, the liquid crystal display panel is formed.

Figure 6:
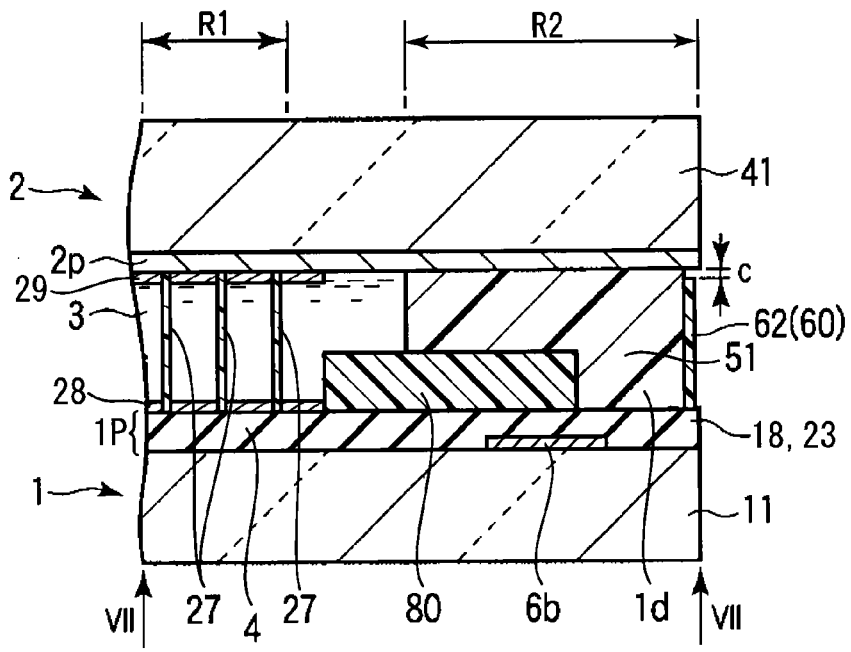
FIG. 6 is an expanded cross-sectional view schematically showing the peripheral portion of the liquid crystal display panel according to other example taken along line VII-VII in FIG. 3.

FIG. 6 is an expanded sectional view showing a modification which schematically shows the peripheral portion of the liquid crystal display panel taken along a line VII-VII of FIG. 3. In this modification, the projections 61 and 62 are formed on the interlayer insulating layer 18 and the protection insulating layer 23 laminated on the TFT in the array substrate 1. The interlayer insulating layer 18 and the protection insulating layer 23 are replaced with the resin layer. The interlayer insulating layer 18 is formed of insulating films of SiO2 and Si3N4. Also in this modification, the same effect as the embodiment shown in FIG. 5 can be acquired.

Figure 7:
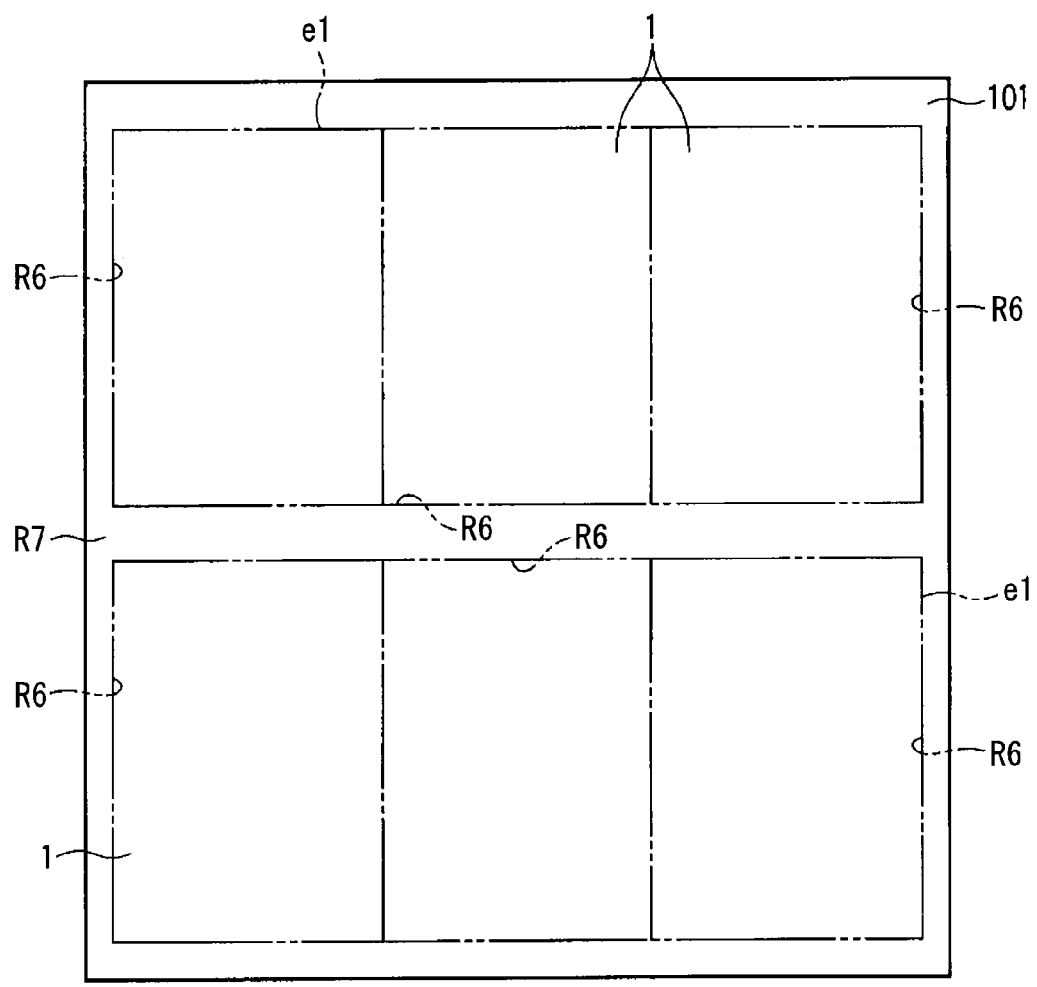
FIG. 7 is a plan view showing a state where an array pattern is formed on a mother glass substrate in a manufacturing process according to the embodiment.

Next, the manufacturing method of the above-mentioned liquid crystal display panel is explained. As shown in FIG. 7, first, a mother glass substrate 101 as the first mother substrate with a larger size than the array substrate 1 is arranged as a transparent insulating substrate. According to this embodiment, the mother glass substrate 101 includes six array substrate formation regions R6 in the rectangular shape in order to form the array substrate 1, and an non-used area R7 outside the array substrate formation region R6. The mother glass substrate 101 is provided with a first dividing proposed line e1 corresponding to the periphery of the array substrate formation region R6.

On the arranged mother glass substrate 101, the array pattern 1p including the signal line 21, the scanning line 17, the TFT, the driving circuits 6a and 6b, etc., are formed using a usual manufacturing process, that is, by repeating a film formation and a patterning of the film.

Figure 8:
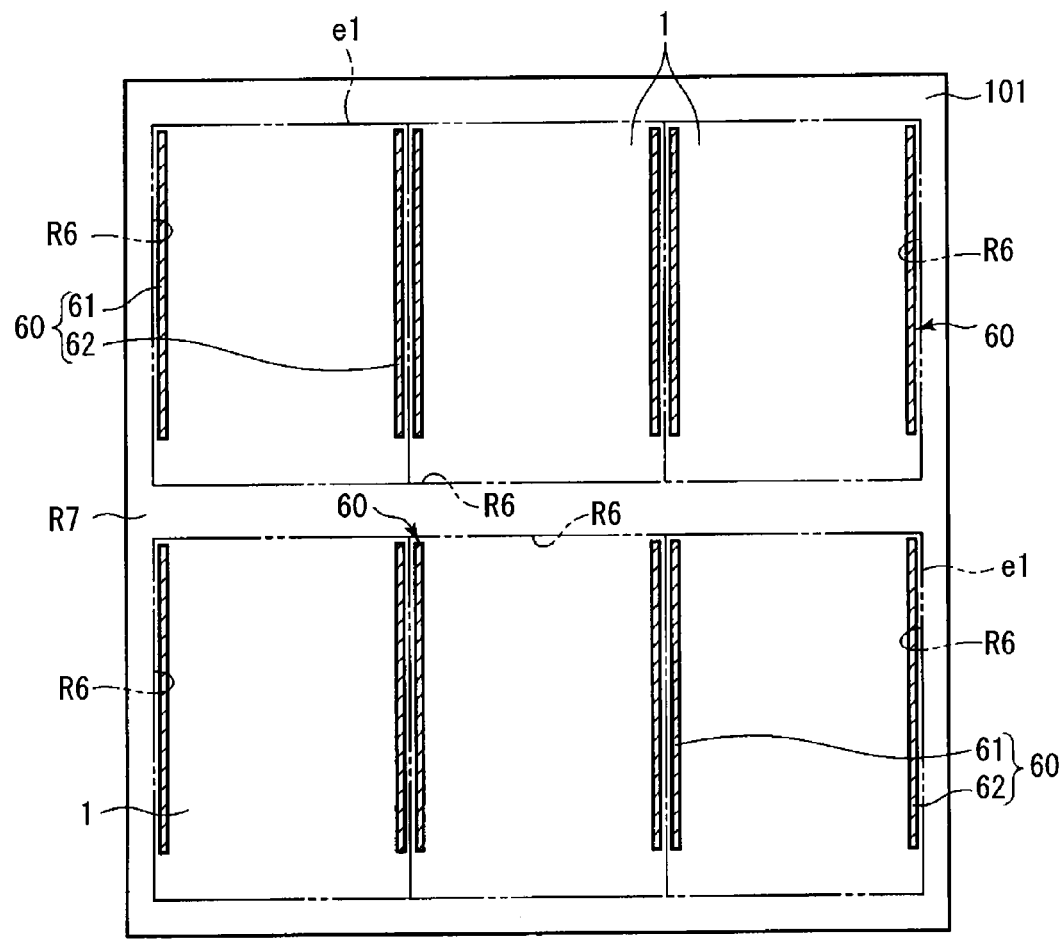
FIG. 8 is a plan view showing the state where a plurality of array substrates with a barrier pattern is formed on the mother glass substrate following the process shown in FIG. 7.

Subsequently, for example, transparent photosensitive resin of acrylic type is applied on the whole surface of the mother glass substrate 101 using a spinner. Then, the transparent resin is dried. Furthermore, patterning exposure of the transparent resin is carried out using a predetermined photomask. Next, the resin is burned and cured after developing the exposed transparent resin. Thereby, as shown in FIG. 8, the pillar-shaped spacer 27 (not shown) and the projections 61 and 62 are formed simultaneously.

Then, the alignment film 28 is formed by applying and patterning the alignment film material on the whole surface of the mother glass substrate 101 including the display region R1. In addition, predetermined orientation treatment (rubbing) is performed to the alignment film 28 if needed. Thereby, the six array substrates 1 are completed with the mother glass substrate 101.

Figure 9:
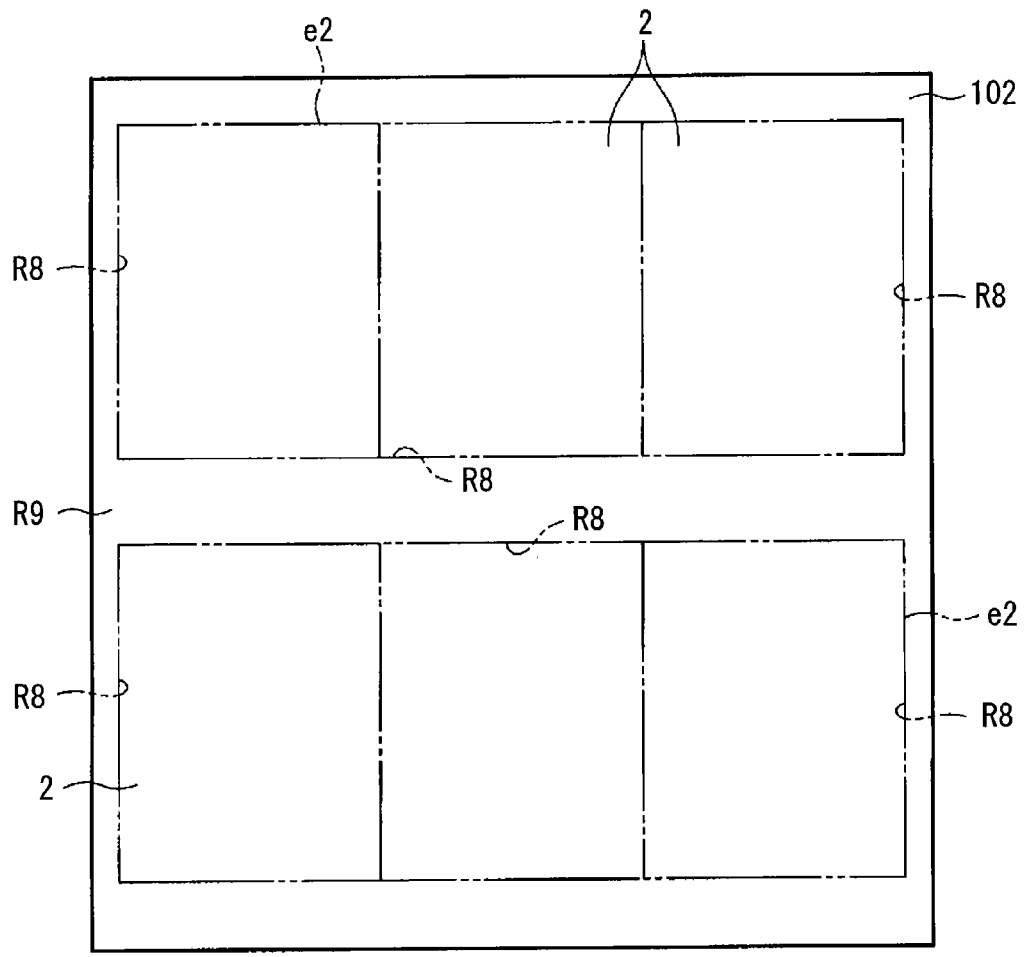
FIG. 9 is a plan view showing the state where a plurality of counter substrates is formed on the mother glass substrate.

FIG. 9 is a plan view showing the state where a plurality of counter substrates is formed on the mother glass substrate in the manufacturing process of the above-mentioned liquid crystal display panel. In the manufacturing method of the counter substrate 2, first, the mother glass substrate 102 as a second mother substrate with a larger size than the counter substrate 2 is arranged as a transparent insulating substrate. According to this embodiment, the mother glass substrate 102 has six counter substrate formation regions R8 of the rectangular shape, and an non-used region R9 in the outside of the counter substrate formation region R8 in order to form the counter substrate 2. The mother glass substrate 102 has a second dividing proposed line e2 corresponding to the periphery of the counter substrate formation region R8.

On the prepared mother glass substrate 102, the counter pattern 2p is formed by the usual manufacturing process. The alignment film 29 is formed on the counter pattern 2P. In addition, the predetermined orientation treatment (rubbing) is performed to the alignment film 29 if needed. Thereby, the six counter substrates 2 are completed with the mother glass substrate 102.

Figure 10:
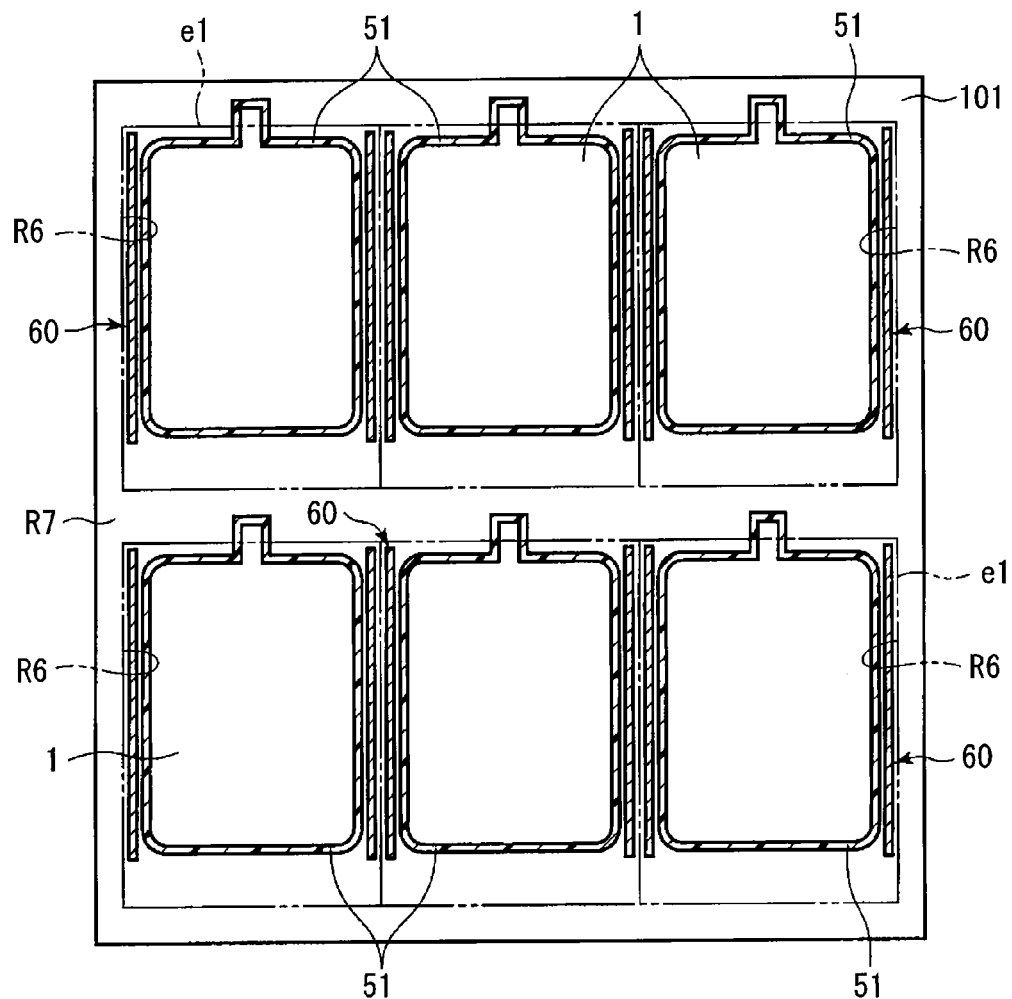
FIG. 10 is a plan view showing the state where a seal material is applied to the mother glass substrate following the process shown in FIG. 8.

FIG. 10 is a plan view showing the state where the seal material is applied on the mother glass substrate. The seal material 51 is formed in a seal material application region R2 arranged in the whole peripheral region of the array substrate 1. The seal material 51 is applied by a printing method, for example, using ultraviolet curing type resin. In more detail, the above-mentioned resin in the frame shape is applied on the array substrate 1 outside the display region R1 so that a portion of above-mentioned resin is made to project. The frame-like seal material 51 with a convex pattern is formed by striding over the first dividing proposed line e1. Moreover, when forming the seal material 51, the counter voltage supply electrode (which is not illustrated) for supplying voltage to the counter substrate 2 from the array substrate 1 is formed on the array substrate 1 in the circumference of the seal material 51.

Figure 11:
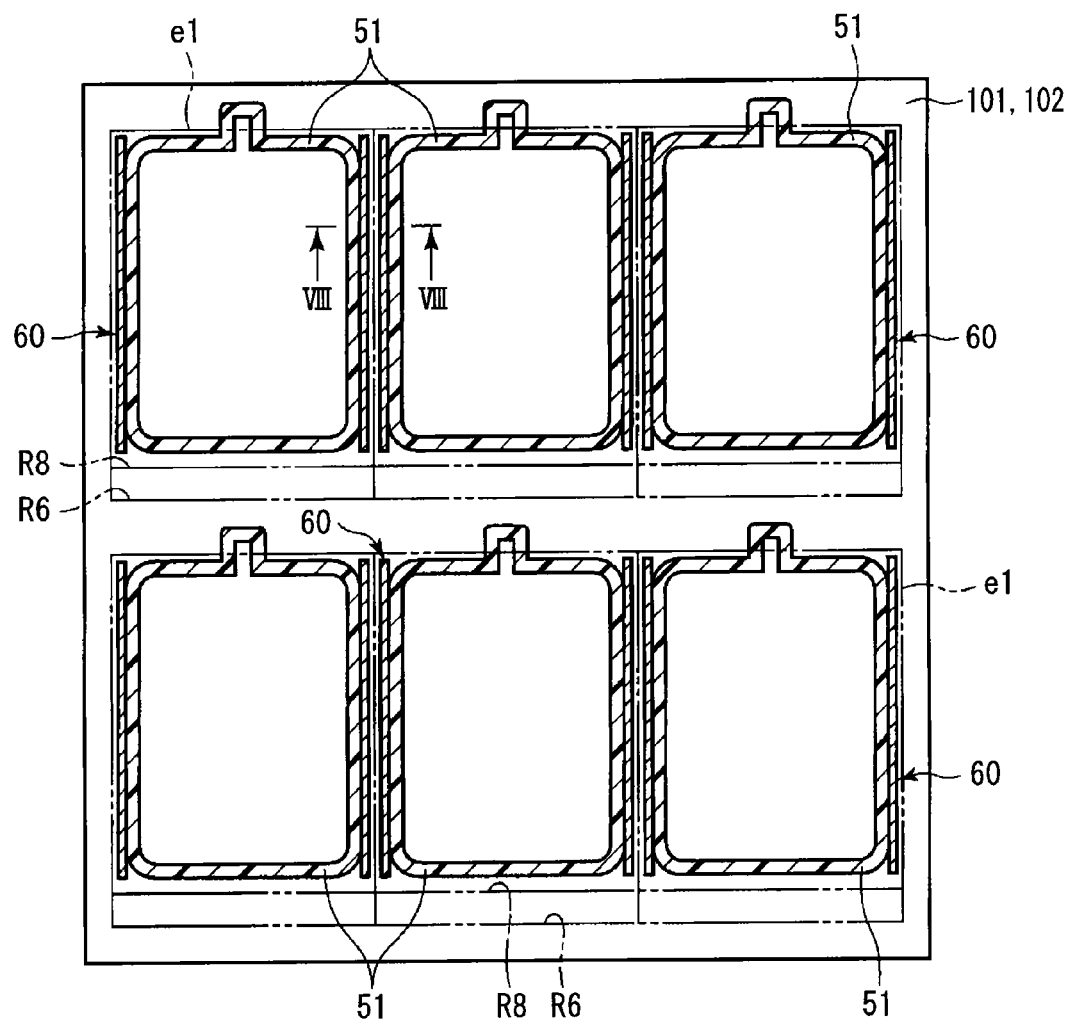
FIG. 11 is a plan view showing the state where the respective mother glass substrates shown in FIG. 9 and FIG. 10 are attached through the seal material.

FIG. 11 is a plan view showing the state where the two mother glass substrates shown in FIG. 9 and FIG. 10 are attached through the seal material 51. The counter arrangement of the mother glass substrate 101 and the mother glass substrate 102 are made so that the alignment films 28 and 29 oppose each other, and that a predetermined gap between the array substrate 1 and the counter substrate 2 is held by a plurality of pillar-shaped spacers 27. Then the peripheral portions of the array substrate 1 and the counter substrate 2 are attached by the seal material 51. Under the present circumstances, the spread of the seal material 51 is suppressed by the projections 61 and 62.

Subsequently, the seal material 51 is irradiated with ultraviolet ray from exterior, and the seal material 51 is cured, and also thermal curing is performed, and then, a complete curing is carried out. Thereby, the mother glass substrate 101 and the mother glass substrate 102 are attached through the seal material 51.

Then, while dividing the mother glass substrate 101 along the first dividing proposed line e1, and the mother glass substrate 102 is divided along the second dividing proposed line e2. When the mother glass substrates 102 and 103 are divided, respectively by drawing scribing lines along the first diving proposed line e1 and the second diving proposed line e2, for example. Thereby, the array substrate 1 is cut away from the mother glass substrate 101, and the counter substrate 2 is cut away from the mother glass substrate 102, respectively. In this time, the convex pattern which forms the liquid crystal injecting mouth 52 in the seal material 51 is cut along the first dividing proposed line e1 and the second division proposed line e2.

Figure 12:
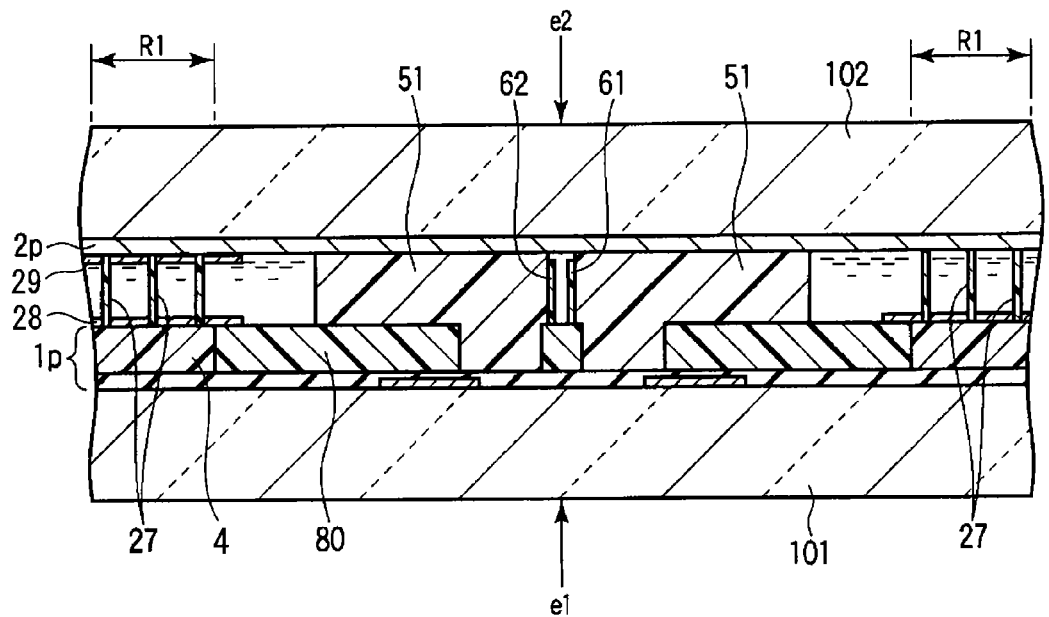
FIG. 12 is a cross-sectional view taken along line VIII-VIII in FIG. 11 showing the state where the respective mother glass substrates are attached through the seal material.

Thereby, six vacant liquid crystal display panels shown in FIG. 3 are taken from the divided mother glass substrates 101 and 102. In the method of manufacturing the liquid crystal display panel according to this invention, as shown in FIG. 12, the insulating layer commonly formed in the adjacent array substrates 1 is arranged in the peripheral regions of the adjacent array substrates 1. The protrusions 61 and 62 are formed on the insulating layer. The first dividing proposed line e1 and the second dividing proposed line e2 are located in the center between the protrusion 61 and the protrusion 62. The protrusion 61 and 62 form the respective protrusions for one display panel and another display panel.

Subsequently, liquid crystal material is injected by vacuum injecting method in the gap between the substrates of each liquid crystal display panel through the liquid crystal injecting mouth 52 shown in FIG. 1 and FIG. 3, which are formed in the seal material 51. Then, the liquid crystal injecting mouth 52 is sealed with a sealing agent 53, such as ultraviolet curing type resin. A liquid crystal is enclosed with the region surrounded by the array substrate 1, the counter substrate 2, and the seal material 51, and thereby the liquid crystal layer 3 is formed. Finally, six liquid crystal display panels are completed, respectively.

In the liquid crystal display panel and the manufacturing method of the liquid crystal display panel according the first embodiment constituted as mentioned-above, the liquid crystal display panel includes the array substrate 1, the counter substrate 2, the liquid crystal layer 3, the projections 61 and 62, and the seal material 51. The projections 61 and 62 are formed in the peripheral portion of the display region R1 interposing the display region R therebetween in the array substrate 1 and forming a gap between the projections 61 and 62 and the counter substrate 2.

The seal material 51 is formed between the array substrate 1 and the counter substrate 2, and arranged between the periphery of one side of the display region R1 and the projection 61, and between the periphery of another side of the display region R1 and the projection 62, and attaches the array substrate 1 and the counter substrate 2. As for the seal material 51, the spread to the array substrate 1 and the counter substrate 2 is suppressed by the projections 61 and 62.

According to this embodiment, the spread of the seal material 51 into the display region R1 can be suppressed also in a liquid crystal display panel with a narrow frame width, and the display defect can be prevented. Since the spread of the seal material 51 to the periphery of the array substrate 1 and the counter substrate 2 is suppressed by the projections 61 and 62, and the seal material 51 does not spread beyond the first dividing proposed line e1 (the second dividing proposed line e2), the array substrate 1 and the counter substrate 2 can be divided in a good state from the mother glass substrates 101 and 102.

Moreover, when cutting down the liquid crystal display panels from the mother glass substrate 101 and 102, the edge which cuts glass contacts the portions of the mother glass substrates 101 and 102, corresponding to the projections 61 and 62, i.e., the dividing proposed lines e1 and e2. When the edge contacts the glass surface, since the wall-like projections 61 and 62 support glass, the pressure of the edge applied to the glass surface is uniformly distributed in the glass. Therefore, it becomes possible to cut the glass substrates without fault, like that the glass substrate may be chipped or broken at the time of the glass cutting.

Figure 16:
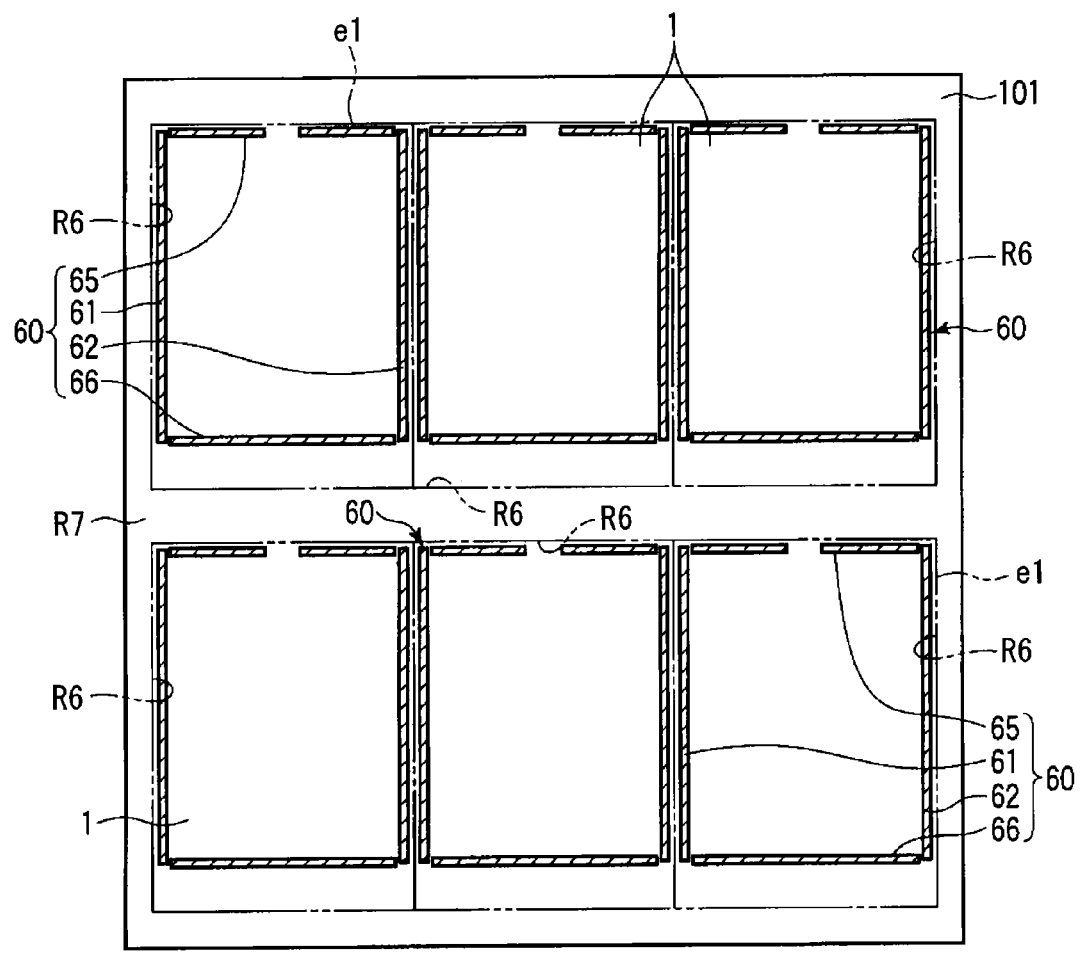
FIG. 16 shows a modification at the time of forming the barrier pattern on the mother glass substrate, and is a plan view showing the state where a plurality of array substrates is formed on the mother glass substrate.

In this embodiment, although the projections 61 and 62 are arranged on right-and-left sides of the peripheral portion of the display region R1 in the liquid crystal display panel, the projections 65 and 66 may be arranged also on the upper and lower sides of the display region R1 of the liquid crystal display panel so that the display region R1 is surrounded as shown in FIG. 16. Here, the projection 65 is formed except for the region facing the liquid crystal injecting mouth 52.

If the barrier pattern 60 is arranged as above-mentioned, it becomes possible to cut without generating fault, like that the glass substrate is chipped or broken at the time of the glass cutting.

Since the projections 61 and 62 can be formed simultaneously with the pillar-shaped spacers 27, the projections 61 and 62 can be formed without increasing the steps of the manufacturing process. Since the projections 61 and 62 are formed lower than the pillar-shaped spacer 27, they can prevent the poor gap of the liquid crystal layer 3. For this reason, deterioration of the display grace can be prevented when the gap of the liquid crystal layer 3 becomes uneven.

Moreover, if the height of the projections 61 and 62 is set to "a", the gap between the array substrate 1 and the counter substrate 2 in the concave portion $1d$ to "b", and the gap between the projections 61 and 62 and the substrates facing the projections to "c", when the figures satisfy the relation of $0<c<a<b$, it becomes possible to prevent the seal material 51 from spreading beyond the divided proposed lines e1 and e2 by the projections 61 and 62.

The array substrate 1 has the concave portion $1d$. Although the seal material 51 spreads in the peripheral portion by attaching the mother glass substrates 101 and 102, a portion of the seal material 51 is accommodated in the concave portion $1d$ of the array substrate 1. For this reason, the spread of the seal material 51 can be suppressed further. Since the concave portion $1d$ can be formed simultaneously when forming the shield pattern 80, the concave portion $1d$ can be formed without increasing the steps of the manufacturing process. As described-above, since the fault does not arise in the array substrate 1 and the counter substrate 2, the liquid crystal display panel and the manufacturing method of the liquid crystal display device can be obtained with a narrow frame width.

Next, the liquid crystal display panel according to a second embodiment is explained. In addition, in this embodiment, the same structure as that of the first embodiment as mentioned-above is denoted by the same marks, and the detailed explanation is omitted. Moreover, the manufacturing method of the liquid crystal display panel is omitted.

Figure 13:
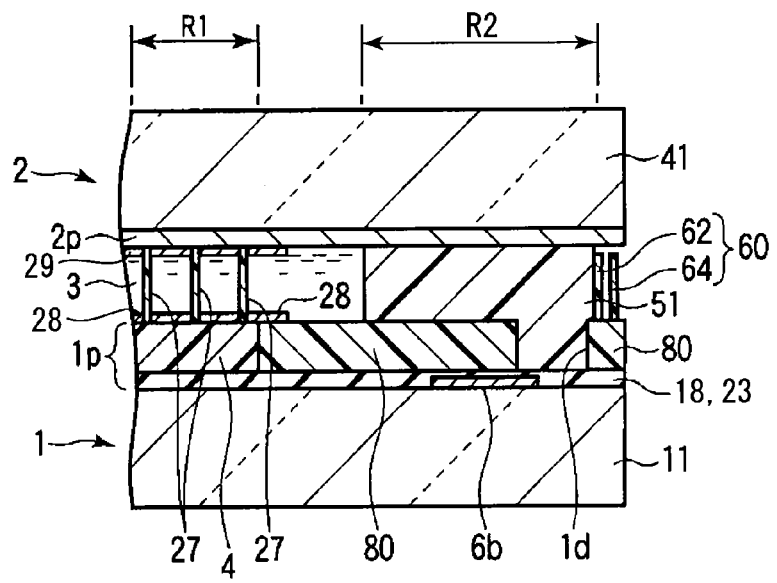
FIG. 13 is an expanded cross-sectional view schematically showing the peripheral portion of the liquid crystal display panel according to a second embodiment.

As shown in FIG. 13, the barrier pattern 60 may be equipped with the projection formed in double or triple. Here, the barrier pattern 60 is formed of two projections. The barrier pattern 60 includes another projection 64 arranged on the outside of the display region, departing more from the projection 61 (62) to the outside of the display region. In addition, like the projection 61 (62), the projection 64 puts a gap between the protrusion 64 and the counter substrate 2.

In the liquid crystal display panel according the second embodiment constituted as mentioned-above, the liquid crystal display panel can acquire the same effect as the liquid crystal display panel according to the first embodiment. Moreover, even if the seal material 51 runs on the projection 61 or the projection 62, another projection (projection 64) located closer to the substrate end accommodates the overflowed seal material. Accordingly, the overflow of the seal material 51 from the periphery of the array substrate, and the periphery of the counter substrate can be protected more certainly and effectively.

Moreover, it becomes possible to cut the glass substrates without the fault, like that the glass may be chipped or broken at the time of the glass cutting. As mentioned-above, the fault does not arise in the array substrate and the counter substrate, and the liquid crystal display panel with narrow frame width can be obtained.

Next, the liquid crystal display panel according a third embodiment is explained. In addition, in this embodiment, the same composition as that of the first embodiment as mentioned-above is given the same mark, and detailed explanation is omitted. Moreover, the manufacturing method of the liquid crystal display panel is omitted.

Figure 14:
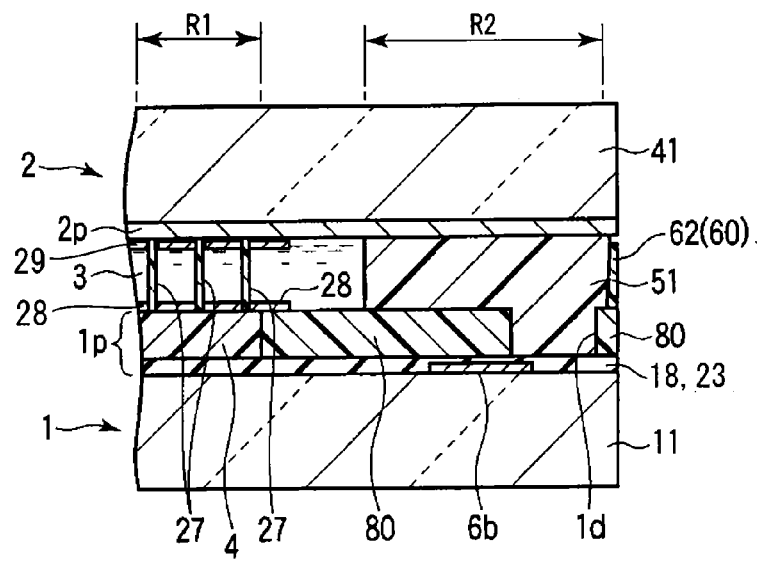
FIG. 14 is an expanded cross-sectional view schematically showing the peripheral portion of the liquid crystal display panel according to a third embodiment.

As shown in FIG. 14, the projections 61 and 62 are located in the periphery of the array substrate 1 and the counter substrate 2, respectively. The respective projections 61 and 62 have cut planes which are aligned with an approximately same plane as the end planes of the array substrate 1 and the counter substrate 2, respectively.

Figure 15:
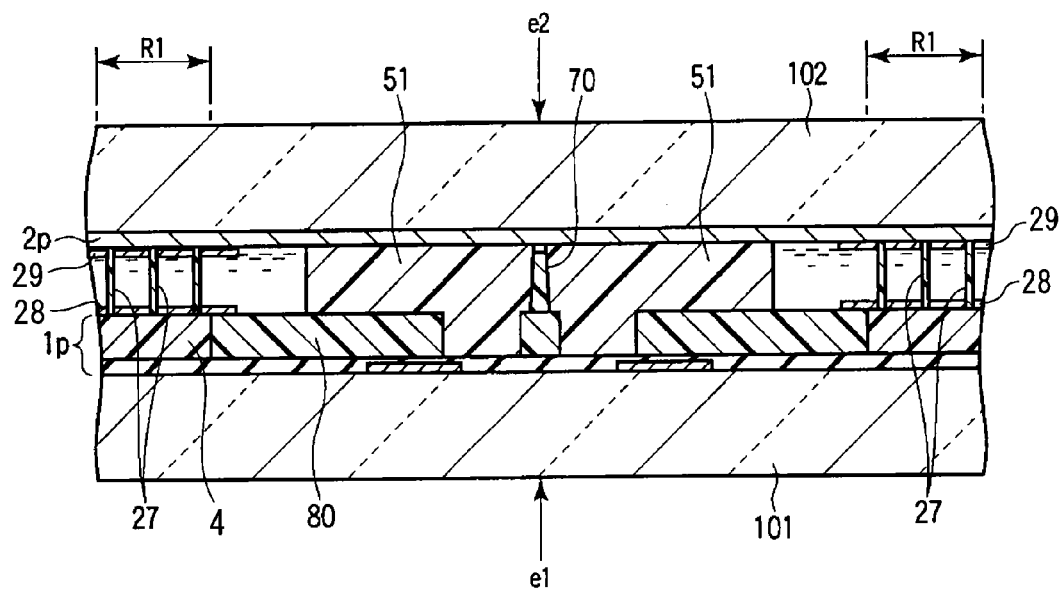
FIG. 15 is a cross-sectional view showing the state where the respective mother glass substrates are attached through the seal material in the manufacturing process of the liquid crystal display panel according to the third embodiment.

In the manufacturing process of the above-mentioned liquid crystal display panel, before taking the array substrates 1 and the counter substrates 2 from the mother glass substrates 101 and 102, a projection 70 is formed so that the projection 70 straddles the first dividing proposed line e1 (the second dividing proposed line e2) as shown in FIG. 15. In detail, the insulating layer formed commonly to the adjacent array substrates 1 is formed in the peripheral regions of the adjacent array substrates 1. The protrusion 70 is formed on the insulating layer. The first dividing proposed line e1 and the second dividing proposed line e2 are located in the center of the protrusion 70. The divided protrusions form the respective protrusions for one display panel and another display panel.

Then, scribing lines are drawn, and the mother glass substrates 101 and 102 are divided along the first dividing proposed line e1 and the second dividing proposed line e2. Since the crack formed in the mother glass substrate 101 progresses in the thickness direction of the mother glass substrate 101, the mother glass substrate 101 is divided along the first dividing proposed line e1, and the projection 70 is also cut along the first dividing proposed line e1. In addition, the divided respective projection 70 functions as the projection 61 of one liquid crystal display panel, and the projection 62 of another liquid crystal display panel.

In the liquid crystal display panel according the third embodiment constituted as mentioned-above, the liquid crystal display panel can acquire the same effect as the liquid crystal display panel according the first embodiment. Moreover, since the projection 70 is arranged on the first divided proposed line e1 (the second divided proposed line e2), when cutting the mother glass substrate 101, it is also necessary to cut the projection 70. However, since the end of the projection 70, and the ends of the array substrate 1 and the counter substrate 2 are aligned with an approximately same plane, the seal material application region R2 can be located closer to the substrate end compared with the liquid crystal display panel according to the first and second embodiments.

Moreover, it becomes possible to cut the glass substrates without the fault, like that the glass may be chipped or broken at the time of the glass cutting. As mentioned-above, the fault does not arise in the array substrate and the counter substrate, and the liquid crystal display panel with narrow frame width can be obtained.

The form of the projection is not limited to the shape of the stripe, and can be changed variously. For example, the form may be a rectangular frame shape (61, 62, 65, 66) as shown in FIG. 16. Neither the position in which the projection of the projections pattern 60 is formed nor the number of the provided projections is limited to the embodiment as described-above, and can be changed variously. For example, it is desirable to arrange the projections in a position in which the seal material 51 may overflow from the peripheries of the array substrate 1 and the counter substrate 2.

The projection which the barrier pattern 60 includes may be arranged so that the projection is arranged on either one of the array substrate 1 and the counter substrate 2 so as to have a gap between the protrusion and the opposing substrate.

Although the concave portion (1d) is arranged in the liquid crystal display panel as mentioned-above, the concave portion (1d) is not necessarily required, and the concave portion (1d) may just be arranged if needed.

While certain embodiments have been described, these embodiments have been presented by way of example only, and are not intended to limit the scope of the inventions. In practice, the structural and method elements can be modified without departing from the spirit of the invention. Various embodiments can be made by properly combining the structural and method elements disclosed in the embodiments. For example, some structural and method elements may be omitted from all the structural and method elements disclosed in the embodiments. Furthermore, the structural and method elements in different embodiments may properly be combined. The accompanying claims and their equivalents are intended to cover such forms or modifications as would fall with the scope and spirit of the inventions.

What is claimed is:

1. A method of manufacturing a liquid crystal display panel including:
   an array substrate including a display region and a peripheral region arranged adjacent to the display region; and
   a counter substrate including the display region and the peripheral region, and arranged opposing the array substrate with a gap therebetween; comprising:

forming respective array patterns on a first array substrate and a second array substrate corresponding to a first display panel and a second display panel on a first mother glass substrate;

forming respective counter patterns on a first counter substrate and a second counter substrate corresponding to the first display panel and the second display panel on a second mother glass substrate;

forming a common insulating layer covering the peripheral regions of the first and second display panels on either one of the first and second mother glass substrates;

forming a resin layer on the common insulating layer in the first and second display panels;

forming a concave portion in the resin layer in the first and second display panels, respectively, by removing a portion of the resin layer;

forming a first protrusion and a second protrusion of the wall shape above the common insulating layer;

forming a plurality of pillar-shaped spacers between the array substrate and the counter substrate so as to have a gap therebetween;

attaching the array substrate and the counter substrate by a seal material provided between the peripheral portion of the display region and the first and second protrusions, respectively, an outer edge portion of the seal material being accommodated in the concave portion; and cutting the first and second mother glass substrates in a region between the first protrusion and the second protrusion from external surfaces of the mother glass substrates.

2. The method of manufacturing a liquid crystal display panel according to claim 1, further comprising forming a color filter layer on the common insulating layer in the respective array patterns in the first and second display panels.

3. The method of manufacturing a liquid crystal display panel according to claim 2, wherein the liquid crystal display panel includes a switching transistor formed in the display region of the array substrate, a protection insulating layer and an interlayer insulating layer formed on the switching transistor and extending to the peripheral region, the common insulating layer in the peripheral region is formed of the protection insulating layer and the interlayer insulating layer, and the color filter layer is formed on the protection insulating layer and the interlayer insulating layer.

* * * * *